US010008458B2

(12) United States Patent
Hareyama (10) Patent No.: US 10,008,458 B2
(45) Date of Patent: Jun. 26, 2018

(54) SEMICONDUCTOR DEVICE CAPABLE OF REALIZING IMPEDANCE CONTROL AND METHOD OF MANUFACTURING THE SAME

(71) Applicant: SONY CORPORATION, Tokyo (JP)

(72) Inventor: Kosuke Hareyama, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days. days.

(21) Appl. No.: 15/316,217

(22) PCT Filed: Jun. 16, 2015

(86) PCT No.: PCT/JP2015/067261
§ 371 (c)(1),
(2) Date: Dec. 5, 2016

(87) PCT Pub. No.: WO2015/198912
PCT Pub. Date: Dec. 30, 2015

(65) Prior Publication Data
US 2017/0154860 A1    Jun. 1, 2017

(30) Foreign Application Priority Data
Jun. 26, 2014    (JP) ................................ 2014-131748

(51) Int. Cl.
*H01L 23/66* (2006.01)
*H01L 21/48* (2006.01)
(Continued)

(52) U.S. Cl.
CPC ............ *H01L 23/66* (2013.01); *H01L 21/486* (2013.01); *H01L 23/49827* (2013.01);
(Continued)

(58) Field of Classification Search
CPC . H01L 23/66; H01L 21/486; H01L 23/49827; H01L 23/49833;
(Continued)

(56) References Cited

U.S. PATENT DOCUMENTS

| 5,757,252 A | 5/1998 | Cho et al. |
| 5,930,665 A | 7/1999 | Cho et al. |

(Continued)

FOREIGN PATENT DOCUMENTS

| CN | 1526097 A | 9/2004 |
| JP | 2003-100941 A | 4/2003 |

(Continued)

OTHER PUBLICATIONS

International Search Report and Written Opinion of PCT Application No. PCT/JP2015/067261, dated Sep. 1, 2015, 12 pages of English Translation and 10 pages of ISRWO.

(Continued)

*Primary Examiner* — Didarul Mazumder
(74) *Attorney, Agent, or Firm* — Chip Law Group (57) ABSTRACT

The present technology relates to a semiconductor device and a method of manufacturing the semiconductor device capable of realizing impedance control of the semiconductor device.
An input/output wiring line 23 and a ground wiring line 22 are such that through glass vias are provided so as to form a strip line structure by blasting or electric discharge machining and thereafter metal films are formed on a surface and a rear surface. It is possible to configure the semiconductor device with the impedance control by adjusting a conductor diameter of the input/output wiring line 23 and an insulating layer thickness between the input/output wiring line 23 and the ground wiring line 22. The present technology may be applied to the semiconductor device.

9 Claims, 8 Drawing Sheets

(51) Int. Cl.
*H01L 23/49* (2006.01)
*H01L 25/18* (2006.01)
*H01P 3/08* (2006.01)
*H01P 11/00* (2006.01)
*H01L 23/498* (2006.01)

(52) U.S. Cl.
CPC .. *H01L 23/49833* (2013.01); *H01L 23/49838* (2013.01); *H01L 23/49894* (2013.01); *H01L 25/18* (2013.01); *H01P 3/081* (2013.01); *H01P 11/003* (2013.01); *H01L 2223/6611* (2013.01); *H01L 2223/6616* (2013.01); *H01L 2223/6627* (2013.01)

(58) Field of Classification Search
CPC ......... H01L 23/49838; H01L 23/49894; H01L 25/18; H01L 2223/6611; H01L 2223/6616; H01L 2223/6627; H01P 3/081; H01P 11/003
USPC ........................................................ 257/664
See application file for complete search history.

(56) References Cited

U.S. PATENT DOCUMENTS

| | | | |
|---|---|---|---|
| 2003/0137056 A1 | 7/2003 | Taniguchi et al. | |
| 2004/0061147 A1* | 4/2004 | Fujita | G06F 11/261 257/232 |
| 2010/0096174 A1 | 4/2010 | Nakano et al. | |
| 2011/0035939 A1* | 2/2011 | Mori | H01L 23/49822 29/852 |
| 2011/0147055 A1* | 6/2011 | Ma | H01L 21/4803 174/255 |
| 2011/0147059 A1* | 6/2011 | Ma | H01L 23/49822 174/258 |
| 2013/0062778 A1 | 3/2013 | Fujii | |
| 2015/0173191 A1 | 6/2015 | Takahashi | |

FOREIGN PATENT DOCUMENTS

| | | |
|---|---|---|
| JP | 2003-218525 A | 7/2003 |
| JP | 2005-259801 A | 9/2005 |
| JP | 2005-294433 A | 10/2005 |
| JP | 2013-58710 A | 3/2013 |
| KR | 10-0870685 B1 | 11/2008 |
| TW | 201418036 A | 5/2014 |
| WO | 2002/057921 A1 | 7/2002 |
| WO | 2008/133010 A1 | 11/2008 |
| WO | 2014/038326 A1 | 3/2014 |

OTHER PUBLICATIONS

International Preliminary Report on Patentability of PCT Application No. PCT/JP20151067261, dated Dec. 27, 2016, 8 pages.

* cited by examiner

SEMICONDUCTOR DEVICE CAPABLE OF REALIZING IMPEDANCE CONTROL AND METHOD OF MANUFACTURING THE SAME

CROSS REFERENCE TO RELATED APPLICATIONS

This application is a U.S. National Phase of International Patent Application No. PCT/JP2015/067261 filed on Jun. 16, 2015, which claims priority benefit of Japanese Patent Application No. JP 2014-131748 filed in the Japan Patent Office on Jun. 26, 2014. Each of the above-referenced applications is hereby incorporated herein by reference in its entirety.

TECHNICAL FIELD

The present technology relates to a semiconductor device and a method of manufacturing the semiconductor device and especially relates to the semiconductor device and the method of manufacturing the semiconductor device capable of realizing impedance control.

BACKGROUND ART

Silicon (Si) is conventionally widely adopted as a substrate (interposer) required when forming a semiconductor device.

However, since silicon (Si) is an expensive material, technology of using an inexpensive glass substrate in place of this is suggested.

However, since several glass substrates of approximately 0.3 to 0.5 mm are stacked when the glass substrate is used, a transmission loss might occur.

Technology of forming a coaxial structure or a microstrip line structure with a drill when an organic substrate is used is suggested as a countermeasure against the transmission loss (refer to Patent Documents 1 and 2).

Also, technology of collectively forming the microstrip line structure by Deep RIE when a silicon substrate is used is suggested as a similar countermeasure (refer to Patent Document 3).

CITATION LIST

Patent Documents

Patent Document 1: Japanese Patent Application Laid-Open No. 2010-166099
Patent Document 2: Japanese Patent Application Laid-Open No. 2008-244703
Patent Document 3: Japanese Patent Application Laid-Open No. 2002-076177

SUMMARY OF THE INVENTION

Problems to be Solved by the Invention

Incidentally, in the technology of Patent Documents 1 and 2 described above, processing for each hole is required when the coaxial structure and the microstrip line structure are formed, so that the number of additional steps is large and it is difficult to use the organic substrate in the first place in view of coefficient of thermal expansion (CTE) mismatch and the like. Therefore, application of the technology to a device in which the glass substrate is used itself might be significantly difficult.

Also, applying a process of forming the microstrip line structure by Deep RIE being the technology of Patent Document 3 to the glass substrate is difficult because an etching rate of the glass substrate is extremely low. Also, although it is possible to avoid a problem by using the silicon substrate only in a layer in which the microstrip line structure in a longitudinal direction is required in stacking of the glass substrate, mixture of the glass substrate and the silicon substrate itself is not easy and also, using the silicon substrate itself might eventually increase a cost.

The present technology is achieved in view of such a condition and this is especially for realizing the impedance control in the semiconductor device in which the glass substrate is used by a simple method.

Solutions to Problems

A semiconductor device according to one aspect of the present technology includes an electrode wiring line formed of a through glass via in a depth direction of a glass substrate filled with metal, and a ground wiring line formed of a through glass via formed in a position away from the wiring line at a predetermined distance in the same direction as the through glass via of the electrode wiring line so as to be substantially linear in a planar direction of the glass substrate filled with metal.

Two ground wiring lines may be arranged substantially in parallel to each other across one electrode wiring line.

The electrode wiring line and the ground wiring line may form a strip line structure.

One electrode wiring line may be arranged and one ground wiring line may be arranged linearly so as to be away from the electrode wiring line by a predetermined distance.

The electrode wiring line and the ground wiring line may form a microstrip line structure.

The through glass via may be formed by electric discharge machining or blasting.

A cross-section of the through glass via forming the electrode wiring line may be circular.

An end opposed to the electrode wiring line of a cross-section of the through glass via forming the ground wiring line may be a curved concave portion corresponding to the circular cross-section of the through glass via of the electrode wiring line.

A cross-section of the through glass via forming the electrode wiring line may be rectangular.

It may be formed of a semiconductor chip stacked on the glass substrate.

It may be formed of a processor chip stacked on the glass substrate.

It may be formed of the processor chip and a memory chip stacked so as to be adjacent to each other on the same glass substrate.

It may be formed of a plurality of glass substrates stacked.

A method of manufacturing a semiconductor device according to one aspect of the present technology is a method of manufacturing a semiconductor device including an electrode wiring line formed of a through glass via in a depth direction of a glass substrate filled with metal, and a ground wiring line formed of a through glass via formed in a position away from the wiring line at a predetermined distance in the same direction as the through glass via of the electrode wiring line so as to be substantially linear in a planar direction of the glass substrate filled with metal, the method including steps of forming the through glass via of the electrode wiring line and the through glass via of the ground wiring line on the glass substrate, forming a thin metal film on a surface and a rear surface of the glass substrate so as to fill the through glass via with metal, and removing the thin film on a portion other than vicinity of the through glass via.

Effects of the Invention

According to one aspect of the present technology, it becomes possible to realize the impedance control in the semiconductor device in which the glass substrate is used.

MODE FOR CARRYING OUT THE INVENTION

<Configuration of Semiconductor Device to Which Present Technology is Applied>

Figure 1:
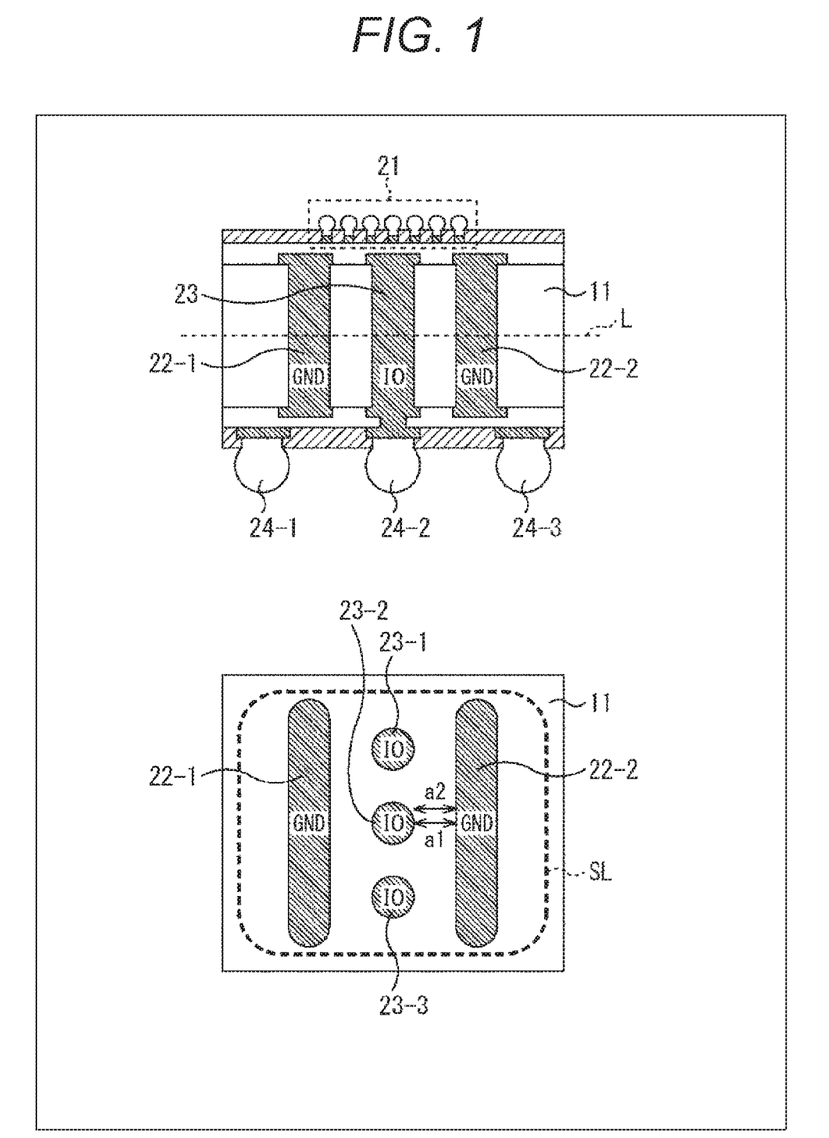
FIG. 1 is a view illustrating a configuration example of a semiconductor device to which the present technology is applied.

FIG. 1 is a view illustrating a configuration of a semiconductor device to which the present technology is applied; an upper part of FIG. 1 is a side sectional view (cross-sectional view in a depth direction) of a glass substrate (interposer) of the semiconductor device and a lower part of FIG. 1 is a cross-sectional view (cross-sectional view in a planar direction) in which a plane surface indicated by a straight line L in the upper part of FIG. 1 is seen from above the drawing.

As illustrated in the upper part of FIG. 1, a wiring line 21 is provided on an upper surface in the drawing and wiring lines 24-1 to 24-3 are provided on a lower surface in the drawing. Meanwhile, although an example in which there are three wiring lines 24-1 to 24-3 is illustrated, the wiring lines are not limited to the wiring lines 24-1 to 24-3. Also, when it is not hereinafter required to especially distinguish the wiring lines 24-1 to 24-3 from one another, they are simply referred to as the wiring lines 24; other configurations are similarly referred to. Furthermore, a direction of a thickness of the glass substrate 11 is referred to as the depth direction and a direction of the surface of the glass substrate 11 perpendicular to the depth direction is referred to as the planar direction.

Input/output wiring lines (IO) 23-1 to 23-3 electrically connected to the wiring line 24-2 and ground wiring lines (GND) 22-1 and 22-2 are provided on the semiconductor device in FIG. 1. Each of the input/output wiring lines 23 and the ground wiring lines 22 is formed as a through glass via (TGV) in the depth direction of the glass substrate 11. Also, as illustrated in FIG. 1, the ground wiring lines (GND) 22-1 and 22-2 are formed as through glass vias (TGV) elongated in a predetermined direction at a predetermined interval (elongated in a vertical direction at a predetermined interval in a horizontal direction in the drawing) as illustrated in the lower part of FIG. 1 in the planar direction of the glass substrate 11. On the other hand, the input/output wiring lines (IO) 24-1 to 24-3 are formed as through glass vias (TGV) having circular cross-sections in the planar direction at a predetermined interval in a predetermined direction (at a predetermined interval in the vertical direction in the drawing) between the ground wiring lines 22-1 and 22-2.

In this manner, the input/output wiring lines 23 are formed at a predetermined interval in the planar direction between the two ground wiring lines 22 formed so as to be elongated in a predetermined direction, so that a strip line structure formed of linear conductive foil in a plate-like dielectric substrate being a transmission path for transmitting an electromagnetic wave is formed. Meanwhile, in the lower part of FIG. 1, a structure SL enclosed by a dotted line is referred to as a strip line structure SL.

The strip line structure SL makes it possible to set impedance by adjusting the input/output wiring line 23 and the ground wiring line 22 as illustrated in the lower part of FIG. 1. In more detail, the impedance corresponds to a conductor diameter forming the input/output wiring line 23 and an insulating layer thickness between the input/output wiring line 23 and the ground wiring line 22 as illustrated in the lower part of FIG. 1. In the lower part of FIG. 1, a minimum insulating layer thickness a1 and a maximum insulating layer thickness a2 between the input/output wiring line 23 and the ground wiring line 22 are illustrated.

Also, the ground wiring line 22 and the input/output wiring line 23 are formed of the through glass vias (TGV) formed by electric discharge machining or blasting, for example, in a layout set on the basis of the conductor diameter of the input/output wiring line 23 and the insulating layer thickness between the ground wiring line 22 and the input/output wiring line 23 according to desired impedance filled with metal.

<Process of Manufacturing>

Figure 2:
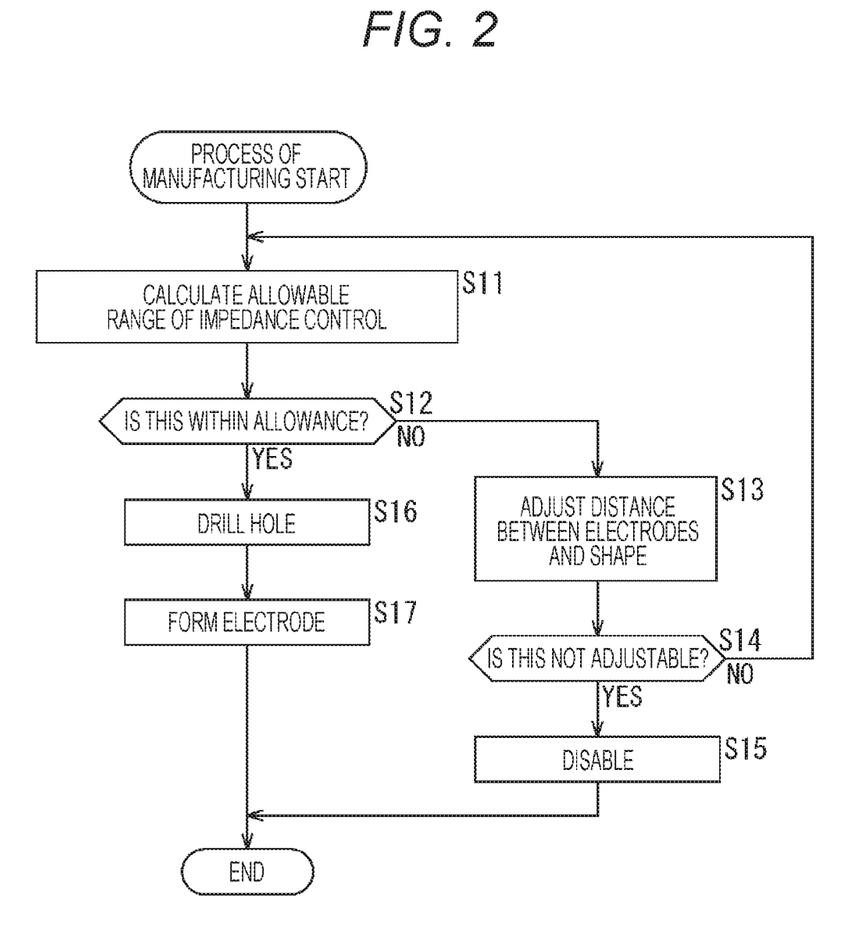
FIG. 2 is a flowchart illustrating a process of manufacturing the semiconductor device in FIG. 1.

A process of manufacturing the semiconductor device in FIG. 1 is next described with reference to a flowchart in FIG. 2.

At step S11, an allowable range in impedance control of the semiconductor device arranged with the conductor diameter of the input/output wiring line 23 and the distance between the input/output wiring line 23 and the ground wiring line 22 currently supposed is calculated.

Figure 3:
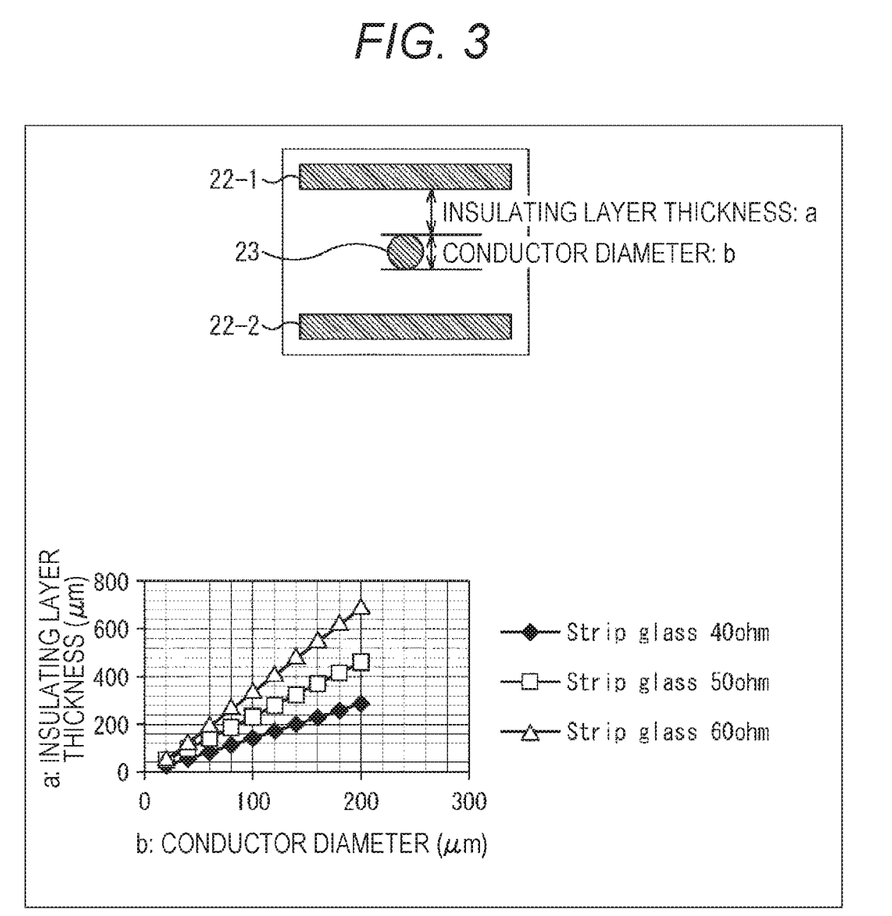
FIG. 3 is a view illustrating a method of calculating when realizing impedance control.

Relationship between the conductor diameter of the input/output wiring line 23 and the insulating layer thickness being the distance between the input/output wiring line 23 and the ground wiring line 22 is the relationship illustrated in a lower part of FIG. 3 for each impedance. That is to say, when the same impedance is set, an insulating layer thickness a increases in proportion to a conductor diameter b and further, the insulating layer thickness a increases as the impedance becomes higher. Meanwhile, in an upper part of FIG. 3, the conductor diameter of the input/output wiring line 23 and the insulating layer thickness being the distance between the input/output wiring line 23 and the ground wiring line 22 in the strip line structure are defined as b and a, respectively. Also, in the lower part of FIG. 3, the relationship between the conductor diameter (um) b of the input/output wiring line 23 plotted along the abscissa and the insulating layer thickness (um) a plotted along the ordinate with respect to each impedance of 40, 50, and 60 ohm is illustrated.

The allowable range of the impedance control is calculated from such relationship.

At step S12, it is determined whether the allowable range of the impedance control is within an allowance.

When this is not regarded within the allowance at step S12, the procedure shifts to step S13.

At step S13, an adjustment amount of the distance between the input/output wiring line 23 and the ground wiring line 22, positional relationship and the like is set.

At step S14, it is determined whether the adjustment amount is adjustable. That is to say, it is determined whether it is not possible to physically adjust.

When it is determined that the adjustment amount exceeds the allowable range and it is not possible to adjust at step S14, it is regarded that design cannot be performed because the allowable range is not within the allowance at step S15, and the process of manufacturing is finished without manufacturing the semiconductor device.

When it is regarded that it is possible to adjust at step S14, the procedure returns to step S11 and the layout is changed on the basis of the conductor diameter of the input/output wiring line 23 and the distance between the input/output wiring line 23 and the ground wiring line 22 with the adjustment amount set at step S13, and then subsequent processes are repeated. That is to say, the processes at steps S11 to S14 are repeated and it is continuously determined whether the allowable range of the impedance control is within the allowance while the layout is changed on the basis of the conductor diameter of the input/output wiring line 23 and the distance between the input/output wiring line 23 and the ground wiring line 22 until it is regarded that the allowable range is within the allowance and there is no problem in the design.

Then, at step S14, when it is regarded that the allowable range of the impedance control is within the allowance and there is no problem in the design, the procedure shifts to step S16.

At step S16, the through glass vias (TGV) corresponding to the input/output wiring line 23 and the ground wiring line 22 are formed in the layout on the basis of the conductor diameter of the input/output wiring line 23 and the distance between the input/output wiring line 23 and the ground wiring line 22 regarded within the allowance of the impedance control described above on the glass substrate 11 being the interposer.

Figure 4:
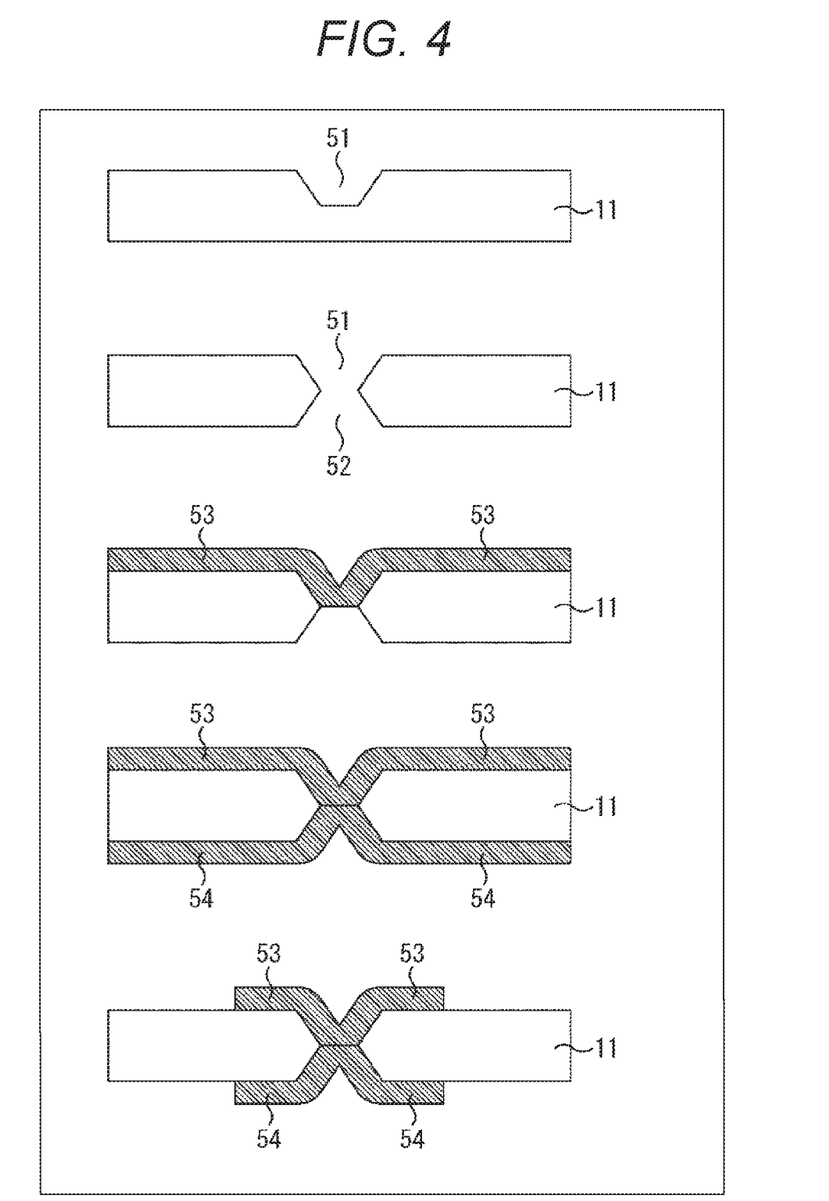
FIG. 4 is a view illustrating a process of forming a through glass via on a glass substrate and filling the same with metal to form a wiring line.

For example, in a case of inexpensive and low-cost blasting, a hole 51 corresponding to a substantially half of the thickness of the glass substrate 11 is formed by blasting from an upper surface in the drawing of the glass substrate 11 as illustrated in an uppermost stage of FIG. 4.

Next, as illustrated in a second stage of FIG. 4, a hole 52 corresponding to a remaining half of the thickness of the glass substrate 11 is formed by blasting from a lower surface in the drawing of the glass substrate 11.

By such a process, the through glass via (TGV) is formed of the holes 51 and 52 as illustrated in the second stage of FIG. 4.

At step S17, the through glass via (TGV) formed in the above-described manner is filled with metal and an electrode is formed.

That is to say, as illustrated in a third stage from above of FIG. 4, a metal film 53 is formed on the upper surface in the drawing of the glass substrate 11 so as to fill the hole 51 with metal.

Next, as illustrated in a fourth stage from above of FIG. 4, a metal film 54 is formed on the lower surface in the drawing of the glass substrate 11 so as to fill the hole 52 with metal.

Then, as illustrated in a lowest stage of FIG. 4, dry etching and the like is applied such that only the metal films 53 and 54 in a region in which the through glass via is provided remain.

By such a process, a penetrating electrode as illustrated in the lowest stage of FIG. 4 is formed. That is to say, by forming such penetrating electrode formed, the input/output wiring line 23 and the ground wiring line 22.

As a result, it becomes possible to manufacture the semiconductor device capable of controlling the impedance. Meanwhile, the through glass via may be formed by electric discharge machining and the like in addition to this, so that an inexpensive and low-cost via as compared to that formed by conventional mechanical drilling and laser processing may be obtained. Of course, the through glass via may also be formed by mechanical drilling and laser processing.

<Impedance Control in Blasting>

An effect of a shape generated in the TGV by blasting is not taken into consideration above when calculating the allowable range in the impedance control, so that this may be considered.

Figure 5:
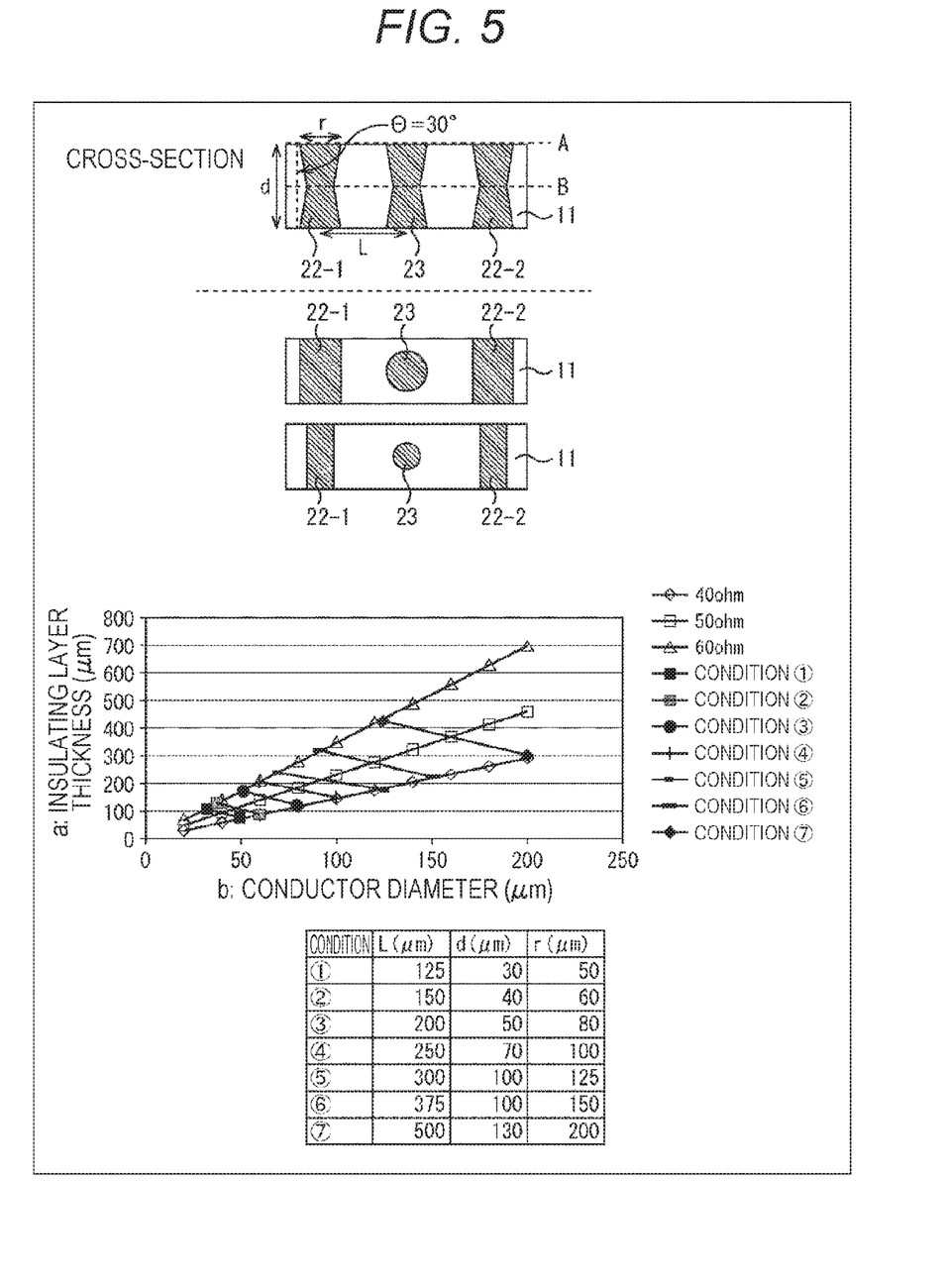
FIG. 5 is a view illustrating a method of calculating when realizing the impedance control in consideration of a taper of the through glass via generated by blasting.

That is to say, when blasting, a taper is generated in the hole as illustrated in an upper stage of an uppermost part of FIG. 5. That is to say, blasting is processing to dig a hole while spraying abrasive on a surface, and according to this, an opening diameter is large in a portion near the surface, but this gradually becomes smaller as the hole is dug in the depth direction. According to this, the taper at a predetermined angle θ in the thickness direction is generated as illustrated in an upper left part of FIG. 5.

Cross-sectional shapes in the planar direction along straight lines A and B in the upper stage of the uppermost part of FIG. 5 are illustrated in middle and lower stages under a dotted line of the uppermost part of FIG. 5, respectively. That is to say, as illustrated in the middle and lower stages under the dotted line of the uppermost part of FIG. 5, the conductor diameter of the input/output wiring line 23 is larger and the ground wiring line 22 is thicker in the planar direction as it is closer to the surface, so that the insulating layer thickness is thinner. On the other hand, the conductor diameter of the input/output wiring line 23 becomes smaller and the ground wiring line 22 becomes thinner in the planar direction as it goes deeper from the surface, so that the insulating layer thickness becomes thicker.

Therefore, it is possible to realize the impedance control with a higher degree of accuracy by taking the conductor diameter, the size (thickness) of the electrode, and the insulating layer thickness into consideration with respect to each depth.

For example, a middle part of FIG. 5 illustrates relationship when the conductor diameter and the insulating layer thickness are taken into consideration according to the depth from the surface together with the impedance.

Meanwhile, in the middle part of FIG. 5, the relationship between the conductor diameter and the insulating layer thickness with respect to each impedance of 40, 50, and 60 ohm in FIG. 3 is illustrated. Furthermore, change in the depth direction when a distance L between centers of the input/output wiring line 23 and the ground wiring line 22, a thickness d of the glass substrate 11, and a conductor diameter r of the surface are changed with seven conditions 1 to 7 illustrated in a lower right part of FIG. 5 when the taper θ illustrated in the uppermost stage of the upper part of FIG. 5 is 30 degrees and relative permittivity ∈r of glass of the glass substrate 11 is 4.6 is illustrated in the lower part of FIG. 5.

For example, it is illustrated that the conductor diameter r is 200 (um), the thickness d of the glass substrate 11 is 130 (um), the distance L between the centers of the electrodes is 500 (um), and the taper 8 is 30 degrees with the condition 7, and the insulating layer thickness increases as the conductor diameter gradually decreases with depth, so that the relationship between the conductor diameter and the insulating layer thickness changes as indicated by a straight line indicated by a rhombus according to the depth in the glass substrate 11. Meanwhile, it is similar for the conditions 1 to 6.

Therefore, the impedance control may be performed with a higher degree of accuracy in consideration of this.

<Regarding Electrode Shape of Input/output Wiring Line and Ground Wiring Line>

Although a case in which the input/output wiring line 23 has a circular shape in the planar direction even with change in the thickness direction of the glass substrate 11 is heretofore described, the electrode shape of the input/output wiring line 23 and the ground wiring line 22 may be other shapes.

Figure 6:
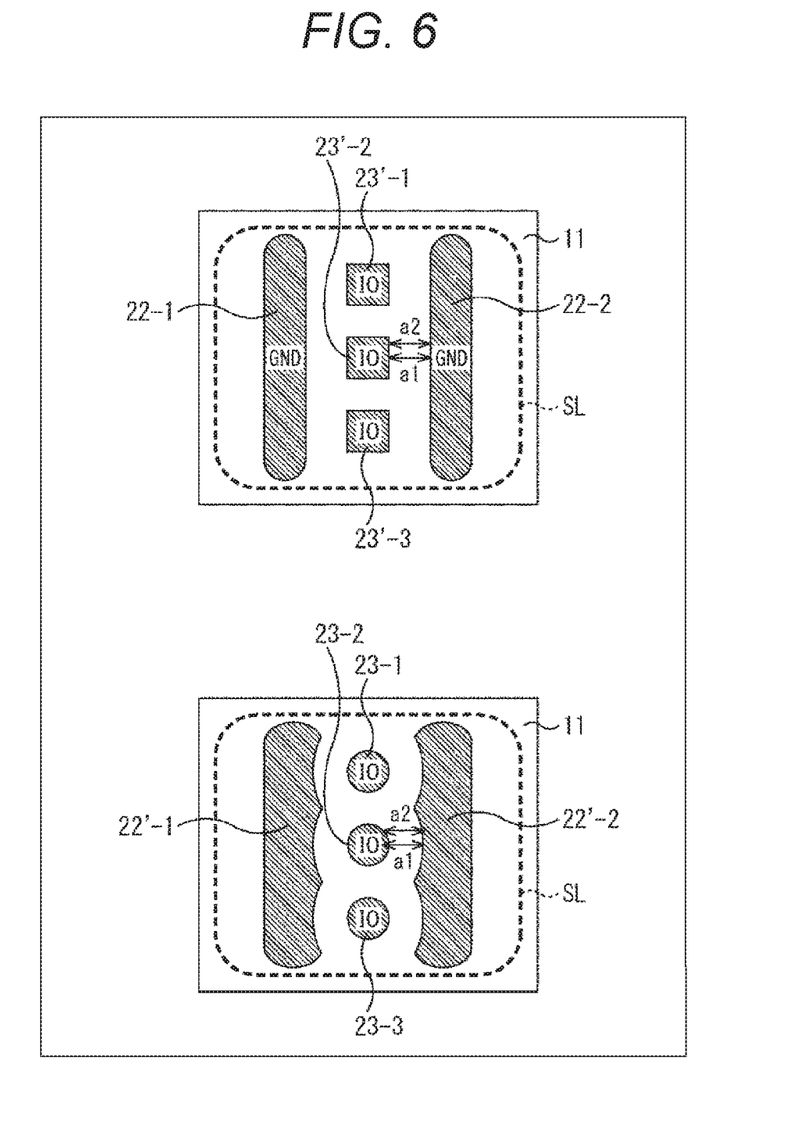
FIG. 6 is a view illustrating an electrode shape of an input/output wiring line and a ground wiring line.

The electrode shape in the planar direction of the input/output wiring line 23 may be other than circular; rectangular input/output wiring lines 23'-1 to 23'-3 as illustrated in an upper part of FIG. 6 are also possible, for example. In this manner, the insulating layer thickness between the input/output wiring line 23' and the ground wiring line 22 becomes uniform, so that it becomes possible to calculate the impedance with a higher degree of accuracy and realize the impedance control with a higher degree of accuracy.

In the process of the TGV, it is easier to make the cross-sectional shape circular than to make this rectangular, so that it is also possible to use the circular cross-sectional shape in the planar direction of the input/output wiring line 23 as-is and change the cross-sectional shape in the planar direction of the ground wiring line 22 to make the insulating layer thickness between the input/output wiring line 23 and the ground wiring line 22 uniform.

For example, as illustrated in a lower part of FIG. 6, it is possible to make the input/output wiring line 23 circular and make a surface opposed to the input/output wiring line 23 of ground wiring lines 22'-1 and 22'-2 to have a corresponding circular concave shape. By such a configuration, the insulating layer thickness between the electrodes of the input/output wiring line 23 and the ground wiring line 22' becomes uniform, so that the impedance may be calculated with a high degree of accuracy. Furthermore, in this case, the through glass via of the input/output wiring line 23 may be circular, so that advanced processing is not necessary; therefore, inexpensive impedance control with a high degree of accuracy may be realized in addition.

Furthermore, when calculating the allowable range of the impedance control in the processes at steps S11 to S14 described above, it is possible to change not only the conductor diameter of the input/output wiring line 23 and the insulating layer thickness between the ground wiring line 22 and the input/output wiring line 23 but also the electrode shape to determine whether this may be within the allowance.

<First Variation>

Figure 7:
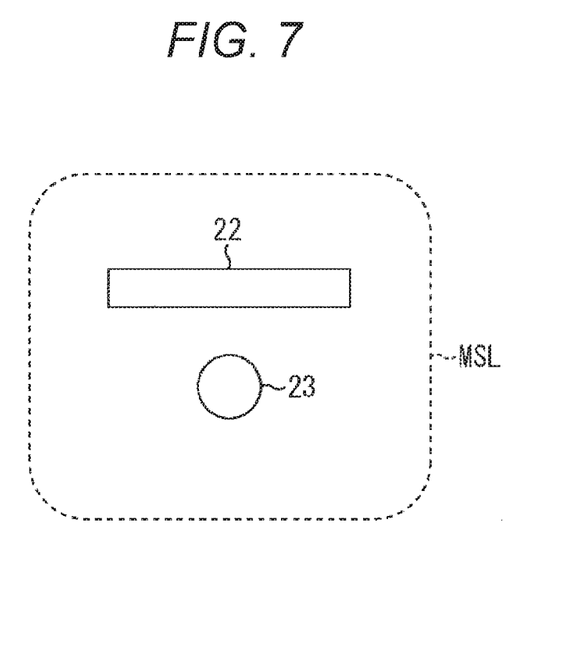
FIG. 7 is a view illustrating a first variation of a semiconductor device of the present technology.

Although an example in which an input/output wiring line 23 and a ground wiring line 22 are made a strip line structure is heretofore described, it is sufficient that impedance is appropriately calculated; therefore, a microstrip line structure MSL illustrated in FIG. 7, for example, is also possible. That is to say, the microstrip line structure MSL is different from the strip line structure in that there is one ground wiring line 22.

Meanwhile, relationship between a conductor diameter of the input/output wiring line 23 and an insulating layer thickness between the input/output wiring line 23 and the ground wiring line 22 regarding calculation of the impedance in impedance control is similar to that with reference to FIG. 3.

That is to say, the impedance control may be realized even with the microstrip line structure MSL.

<Second Variation>

Figure 8:
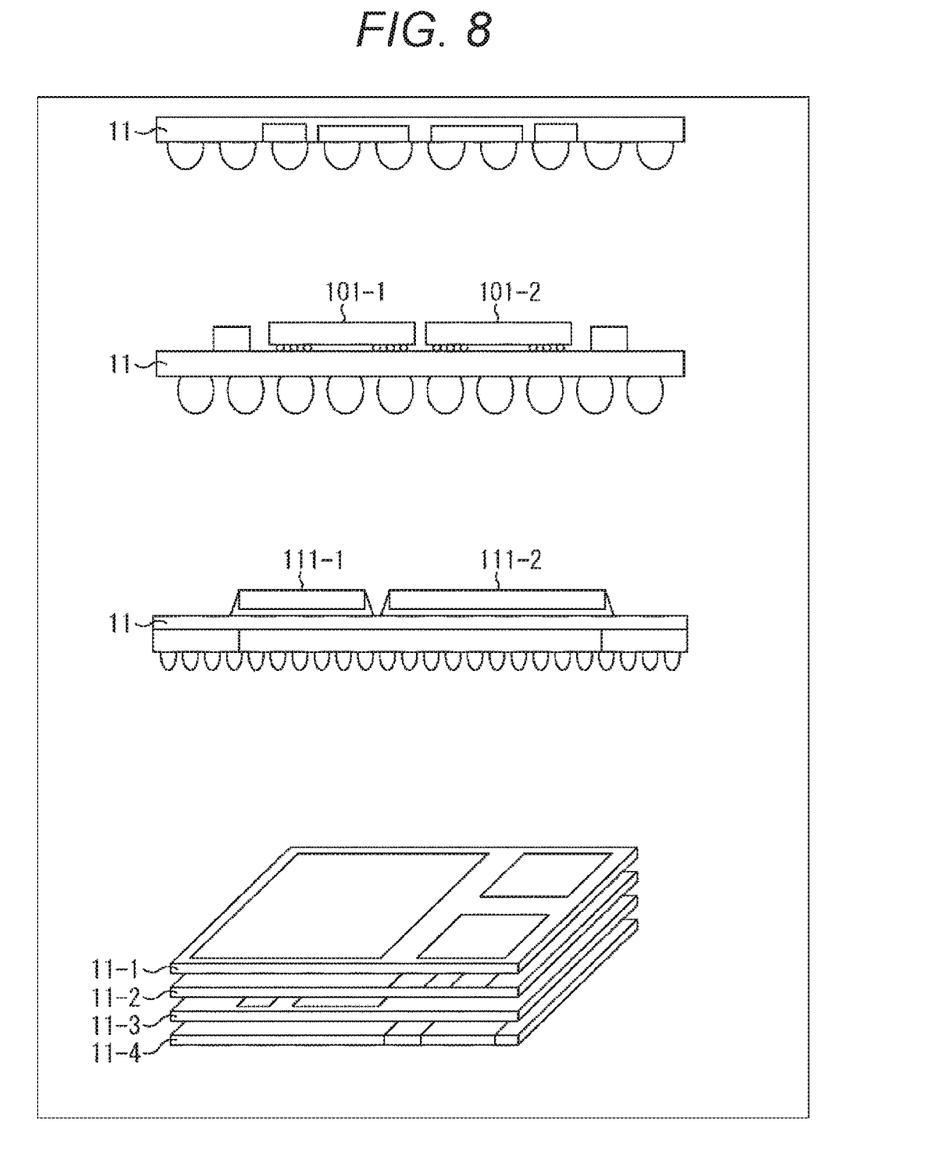
FIG. 8 is a view illustrating a second variation of a semiconductor device of the present technology.

Although a semiconductor device formed of one glass substrate 11 is heretofore described as illustrated in an uppermost stage of FIG. 8, this may also have another configuration.

For example, a similar effect is obtained even in a case in which certain semiconductor chips 101-1 and 101-2 are provided on the glass substrate 11 as illustrated in a second stage from above of FIG. 8.

Also, a similar effect is obtained even in a case in which processor chips 111-1 and 111-2 are provided on the glass substrate 11 as illustrated in a third stage from above of FIG. 8. Meanwhile, an example in which the two processor chips 111-1 and 111-2 are provided on the same glass substrate 11 is described in the third stage from above of FIG. 8, any one of them may be a memory chip. In this case, the processor chip and the memory chip are provided so as to be adjacent to each other on the same glass substrate 11. According to this, an arranging distance between the processor chip and the memory chip may be made significantly short, so that a wiring line distance may be made short. As a result, low impedance may be realized, so that it becomes possible to decrease a heating value regarding operation and improve an operating speed.

Furthermore, a similar effect is obtained in a configuration in which a plurality of glass substrates 11 illustrated as glass substrates 11-1 to 11-4 is stacked as illustrated in a lowest stage of FIG. 8.

As described above, according to the present technology, it becomes possible to realize impedance control in the semiconductor device in which the glass substrate is used.

In addition, each step described in the above-described flowchart may be executed by one device or may be shared to be executed by a plurality of devices.

Furthermore, when a plurality of processes is included in one step, a plurality of processes included in one step may be executed by one device or may be shared to be executed by a plurality of devices.

Meanwhile, the present technology may also have a following configuration.

(1) A Semiconductor Device Including:

an electrode wiring line formed of a through glass via in a depth direction of a glass substrate filled with metal; and a ground wiring line formed of a through glass via formed in a position away from the wiring line at a predetermined distance in the same direction as the through glass via of the electrode wiring line so as to be substantially linear in a planar direction of the glass substrate filled with metal.

(2) The semiconductor device according to (1), wherein two ground wiring lines are arranged substantially in parallel to each other across one electrode wiring line.

(3) The semiconductor device according to (1) or (2), wherein the electrode wiring line and the ground wiring line form a strip line structure.

(4) The semiconductor device according to (1), wherein one electrode wiring line is arranged and one ground wiring line is arranged linearly so as to be away from the electrode wiring line by a predetermined distance.

(5) The semiconductor device according to (1) or (4), wherein the electrode wiring line and the ground wiring line form a microstrip line structure.

(6) The semiconductor device according to any one of (1) to (5), wherein
the through glass via is formed by electric discharge machining or blasting.

(7) The semiconductor device according to any one of (1) to (6), wherein
a cross-section of the through glass via forming the electrode wiring line is circular.

(8) The semiconductor device according to (7), wherein
an end opposed to the electrode wiring line of a cross-section of the through glass via forming the ground wiring line is a curved concave portion corresponding to the circular cross-section of the through glass via of the electrode wiring line.

(9) The semiconductor device according to any one of (1) to (6), wherein
a cross-section of the through glass via forming the electrode wiring line is rectangular.

(10) The semiconductor device according to any one of (1) to (9)
formed of a semiconductor chip stacked on the glass substrate.

(11) The semiconductor device according to any one of (1) to (10)
formed of a processor chip stacked on the glass substrate.

(12) The semiconductor device according to any one of (1) to (11)
formed of the processor chip and a memory chip stacked so as to be adjacent to each other on the same glass substrate.

(13) The semiconductor device according to any one of (1) to (12)
formed of a plurality of glass substrates stacked.

(14) A method of manufacturing a semiconductor device including
an electrode wiring line formed of a through glass via in a depth direction of a glass substrate filled with metal, and
a ground wiring line formed of a through glass via formed in a position away from the wiring line at a predetermined distance in the same direction as the through glass via of the electrode wiring line so as to be substantially linear in a planar direction of the glass substrate filled with metal, the method including steps of:
forming the through glass via of the electrode wiring line and the through glass via of the ground wiring line on the glass substrate;
forming a thin metal film on a surface and a rear surface of the glass substrate so as to fill the through glass via with metal; and
removing the thin film on a portion other than vicinity of the through glass via.

REFERENCE SIGNS LIST

11 Glass substrate
21 Wiring line
22, 22-1 to 22-3 Ground wiring line
23, 23-1 to 26-3 Input/output wiring line
51, 52 Hole
53, 54 Metal film

The invention claimed is:

1. A semiconductor device, comprising:
an electrode wiring line in a depth direction of a glass substrate filled with metal;
wherein a planar view of the electrode wiring line is of a circular shape; and
a ground wiring line at a position away from the electrode wiring line at a distance in a same direction as the electrode wiring line to be linear in the depth direction of the glass substrate filled with the metal;
wherein the electrode wiring line and the ground wiring line are shaped as a through glass via; and
wherein a surface of the ground wiring line, correspondingly opposed to the planar view of the electrode wiring line having the circular shape, is a circular concave surface.

2. The semiconductor device according to claim 1, wherein two ground wiring lines are arranged in parallel across the electrode wiring line, wherein the two ground wiring lines include the ground wiring line.

3. The semiconductor device according to claim 2, wherein the electrode wiring line and the ground wiring line are arranged in a strip line structure.

4. The semiconductor device according to claim 1, wherein the electrode wiring line and the ground wiring line are arranged linearly to be away from each other by the distance.

5. The semiconductor device according to claim 4, wherein the electrode wiring line and the ground wiring line are arranged in a microstrip line structure.

6. The semiconductor device according to claim 1, further comprising:
a semiconductor chip stacked on the glass substrate.

7. The semiconductor device according to claim 1, further comprising:
a processor chip stacked on the glass substrate.

8. The semiconductor device according to claim 1, further comprising:
a processor chip and a memory chip stacked on the glass substrate, wherein the processor chip is adjacent to the memory chip.

9. The semiconductor device according to claim 1 further comprising:
the glass substrate comprises a plurality of glass substrates.

* * * * *